United States Patent [19]
Goodwin et al.

[11] Patent Number: 6,043,987
[45] Date of Patent: Mar. 28, 2000

[54] PRINTED CIRCUIT BOARD HAVING A WELL STRUCTURE ACCOMMODATING ONE OR MORE CAPACITOR COMPONENTS

[75] Inventors: Paul M. Goodwin, Littleton, Mass.; John Nerl, Londonderry, N.H.

[73] Assignee: Compaq Computer Corporation, Houston, Tex.

[21] Appl. No.: 08/918,248

[22] Filed: Aug. 25, 1997

[51] Int. Cl.[7] ...................................................... H05K 1/18
[52] U.S. Cl. ........................ 361/763; 361/761; 361/764; 257/724
[58] Field of Search ............................ 174/260; 257/723, 257/724, 904, 924, 528, 532, 533, 700, 777; 361/761–764; 439/68, 69, 82, 83; 333/181, 183, 185, 172

[56] References Cited

U.S. PATENT DOCUMENTS

| | | | |
|---|---|---|---|
| 4,964,019 | 10/1990 | Belanger, Jr. ............................ | 361/764 |
| 5,780,776 | 7/1998 | Noda ........................................ | 361/764 |
| 5,831,833 | 11/1998 | Shirakawa et al. ...................... | 361/764 |

FOREIGN PATENT DOCUMENTS

| | | | |
|---|---|---|---|
| 61-6846 | 1/1986 | Japan .................................... | 257/724 |
| 1-245588 | 9/1989 | Japan . | |
| 1-258446 | 10/1989 | Japan . | |
| 2-301183 | 12/1990 | Japan . | |
| 4-73992 | 3/1992 | Japan . | |
| 5-218615 | 8/1993 | Japan . | |
| 5-251840 | 9/1993 | Japan . | |
| 6-6043 | 1/1994 | Japan . | |
| 6-196836 | 7/1994 | Japan . | |
| 7-30059 | 1/1995 | Japan . | |
| 7-263619 | 10/1995 | Japan . | |
| 7-307412 | 11/1995 | Japan . | |

*Primary Examiner*—Leo P. Picard
*Assistant Examiner*—John B. Vigushin
*Attorney, Agent, or Firm*—Sharp, Comfort & Merrett, P.C.

[57] ABSTRACT

Printed Circuit Board fabrication costs are decreased, and device placement densities are increased by the use of well structures designed for receiving components such as capacitors on portions of the PCB directly beneath integrated circuit packages having very low vertical profiles. With such an arrangement it is possible to use newer low profile packages and still place a capacitor under the integrated circuit package for reduced area consumption and improved inductance and circuit cycle times. Further advantages of the present arrangement include a reduction in the number of vias that need to be drilled in the PCB to make capacitor attachments, a consequent improvement in PCB inductance and parasitic capacitance, and improved electrical properties for voltage reference planes and routing layers.

17 Claims, 3 Drawing Sheets

PRINTED CIRCUIT BOARD HAVING A WELL STRUCTURE ACCOMMODATING ONE OR MORE CAPACITOR COMPONENTS

BACKGROUND OF THE INVENTION

This invention relates generally to fabrication of printed circuit boards (PCBs), and more particularly, to the fabrication of printed circuit boards for integrated circuits (ICs) that operate at high frequencies and require close coupled capacitors to reduce switching noise levels.

As is generally known in the art, high speed integrated circuits frequently require what are known as "decoupling" capacitors to reduce the local voltage variations (known as "switching noise") created by the operation of transistors. Typically, the capacitors (caps) are mounted either on the PCB where ever space is available, or directly under the ICs to conserve valuable board space and increase the density of electrical components on the PCB.

As is also well-known in the art, the "electrical distance" between these "decoupling" capacitors and the IC package must be made as small as possible to decrease the time required for the charge in the capacitor to reach the IC. This problem becomes worse as the speed of the IC increases because the amount of time that an electric charge in the capacitor takes to flow into the IC may become longer than the time needed in the IC to completely switch from one state into another. Thus, in this art capacitors must be placed directly beneath the IC packages. With capacitors placed beneath the IC package, the typical distance between the package leads and capacitor is minimized because the entire periphery of the IC package is as close as possible to the capacitor located in the middle of the leads.

With typical integrated circuit packages, such as Plastic Leaded Chip Carriers (PLCCs), Leaded Chip Carriers (LDCCs), or Small Outline J Bends (SOJs) the height or distance between the bottom of the package and the top of the printed circuit board is sufficient for a capacitor to be placed on the PCB without approaching too near the bottom of the IC package. As is well known, one reason why a gap is required between the capacitor and the bottom of the IC package, is that to properly clean the PCB underneath the packages, one must have enough space for fluids, such as cleaning solutions, to flow freely. This cleaning procedure removes the remains of soldering residues, such as flux.

Another well known problem is that the maximum height of IC packages on the board must be reduced (i.e., must have a lower height profile). This is due to the desire to put components on both sides of a board and still have sufficient space between boards in a computer system. Thus, there is a need to reduce the height of IC packages, and to have capacitors located beneath the IC package. Further, as the operating frequencies of ICs increase with subsequent generations of technology, the need for larger effective decoupling capacitances becomes more critical. Larger capacitances typically require physically larger capacitors and thus require more space beneath the IC package to place capacitors on the PCB.

Prior art problems with capacitor placement underneath the ICs results in placement of capacitors and other components along side of the IC. Such an action results in other problems including space and density considerations, electrical requirements, board thickness limits and device speed limits. Capacitor placement issues aren't limited to devices that require high chip densities and have space considerations. There are additional electrical considerations that also benefit from having capacitors placed beneath the IC package. Typically individual IC leads that require what is known as "bypass" or "decoupling" relative to one another are often on opposite sides of the IC package. Thus, if the capacitor was positioned at one side of the IC, then whichever one of the leads that was on the same side as the capacitor would have a better and shorter connection to the capacitor than the lead that was on the other side of the package. Thus there would be an uneven and unbalanced bypass capacitance.

Second, the overall length of the traces on the PCB (i.e., the path length of the electrical charge going from the capacitor to the IC) through two leads which are on opposite sides of the package is greatly increased by positioning the capacitors on the side of the IC package, rather than underneath, and this increase in trace length consequently increases the total inductance of the circuit. As IC speeds increase, this inductance becomes a greater problem because it can easily rise to a level which effectively disconnects the capacitor from the IC during the time period in which the currents are flowing. Thus the capacitor becomes effectively useless (known as decoupled).

The third problem is that current designs frequently require increased levels of capacitance (or the same capacitance value with a lower effective series resistance and inductance) and this results in a need for increased sized capacitors. Thus the ability to continue to place capacitors directly underneath ICs packaged in the newer low profile packages is critical for speed and space reasons.

In the prior art, it was also known to put capacitors and other components on the opposite side of the board from the active devices. This method places the capacitor electrically closer to the IC than positioning the capacitor next to the IC package since the PCBs are typically about 0.064 inches thick. Opposite side capacitor placement eliminates many of the above noted problems of placing capacitors beside the ICs, such as increased path length and unbalanced electrical paths. However, this is no longer an acceptable solution in the art because the advent of what is known as "surface mounting" (as opposed to the older method of "thru-hole" type dual in line package (DIP) type mounting), makes it possible and desirable to put active components on both sides of the PCB. With dual sided PCBs, one board can be made to do the work of two, and thus the size of the overall system is reduced by half, as well as having increased potential operating frequencies due to shorter overall electrical path lengths.

Under similar circumstances requiring close coupling capacitors, the previous solution applied for cases where inadequate space existed beneath the IC package for the capacitors, was to mount the caps directly on top of the IC Package. In order to do this the IC Package required specially designed metal pads on the package top to attach to the leads of the capacitor. This frequently required that the IC Package be comprised of an expensive ceramic. However, the extremely high cost of these specially designed ceramic packages is not acceptable for low cost memories such as DRAMs. Further, the fact that the height of the IC package was increased by the addition of the caps on top of the IC package makes this method undesirable.

Thus, the prior art has two distinct problems with capacitors and low profile IC packages. The space between the IC package and the PCB is decreasing because of height requirements, and the need for larger capacitances and thus physically larger capacitors beneath the IC package on the PCB requires more space between the IC package and the PCB. This results in a conflict in the needs of the prior art for capacitors on PCBs immediately beneath IC packages.

SUMMARY OF THE INVENTION

In accordance with the present invention, a printed circuit board (PCB) includes patterned interconnect layers with insulating layers disposed between patterned layers, with at least one of the insulating layers having a selected region removed to create well structure to attach an electrical component below the surface of a PCB. Well structures may be known as "capwells", "voids" or "cutouts".

Such a well structure has at least two electrically isolated metal conductor surfaces for the attachment of capacitor or other discreet component, and the depth of the well will be determined by the size of the capacitor (or other component type) required to "decouple" the IC package placed directly above the capacitor location (or provide another function), and by the thickness of the individual layers of conductive and insulating material used to make the PCB (called laminate).

With such an arrangement, the clearance between the IC package and the capacitor is maintained sufficiently large to allow continued placement of capacitors or other components, beneath the new lower profile IC packages, thus saving PCB space, and still allowing proper PCB cleaning.

An additional benefit of the present arrangement is that the coupling delay between the capacitor or other electrical component and the IC package is minimized. Using a well structure as described, the capacitor is attached to interior layers of the PCB and below the top surface of the PCB. Thus the length of the leads from the capacitor to the IC is minimized, and the delay and impedance of the connection is reduced.

In accordance with an alternative embodiment of the present invention the well structure is one of a plurality of well structures disposed at least partially beneath an integrated circuit package. With such an arrangement a larger total capacitance may be added to a specific IC than is possible using a single capacitor of a size small enough to fit beneath the IC. Another advantage of this embodiment is the ability to provide separate capacitance to each individual side of an IC, thereby permitting electrical balancing of capacitive load and coupling distance.

In accordance with yet another alternative embodiment of the present invention the well structure is large enough to contain multiple pads for multiple capacitors within a single large well. With such an arrangement the benefits of capacitive balancing may be obtained with out increasing the cost of manufacture. The specific decision as to multiple components within a single large well, or multiple small wells with a single component in each, or a single well with a single component will depend on the specific needs of the design and the specific attachment process being used.

An additional benefit of all of the above noted arrangements includes very low inductance connections (roughly half that of previous methods) between capacitor and IC. This is because previous methods required at least to two contact holes, or "vias", to connect the capacitor to the PCB, i.e., one for each side of the capacitor. As will be further described in the preferred embodiment, the present arrangement requires only a single contact hole or via, since the other connection may be made directly to the PCB power or ground plane. Since each contact hole or via adds more inductance to the capacitor electrical path, the reduction in the number of vias, as compared to the previous method, may cut inductance by half.

In addition to the inductive improvement noted above, each of the contact holes or vias also adds capacitance to the system because of the increased length of the electrical path thru dielectric materials, such as PCB insulators. Thus the present arrangement may reduce parasitic capacitance and the variations of capacitance due to varying path lengths between two different parts of the IC package is reduced.

Yet a further advantage of the present arrangement is that drilling contact holes, or vias, on PCBs adds to the cost of manufacture. The fewer contacts required, the lower the cost of the board. The holes associated with contacts or vias interfere with metal placement on all layers of the PCB. Contact holes decrease the conductivity of a metal layer if it is used as a voltage plane, because fewer vias equals fewer holes in the continuity of the voltage plane. Thus ground and power planes may be more continuous and thus have better electrical properties than previously available.

Contact holes or vias also interfere with designing and placing metal lines for use as a signal routing layer. Thus requiring fewer contact holes (and as noted previously the present arrangement reduces the number of contacts or vias required for capacitors by half over the prior art) means that there are more available "routing channels" than previously, and thus, it is easier to design a PCB to contact the leads on all of the IC packages on a PCB.

The present invention allows the use of modern low-profile packages and still position capacitors beneath the low profile IC packages, resulting in lower profile and lower PCB space requirements. Typically, capacitors might require 0.030 inch between the package and the PCB in order to allow for proper mounting and cleaning of the capacitors. With the present arrangement results in a reduction of total board thickness of up to 0.030 inch. This increases the number of boards that can be placed within a given volume of an electrical device than was possible in the prior art, or conversely allows for smaller electronic devices.

Thus the present arrangement provides capacitors located close to the IC package, with minimized PCB lead lengths, balanced lead lengths, improved PCB performance and manufacturing costs, and permits continued use of inexpensive low profile IC packages.

BRIEF DESCRIPTION OF THE DRAWINGS

The foregoing features of this invention as well as the invention itself, may be more fully understood from the following detailed description read together with the accompanying drawings, in which.

DESCRIPTION OF THE PREFERRED EMBODIMENT

Figure 1A:
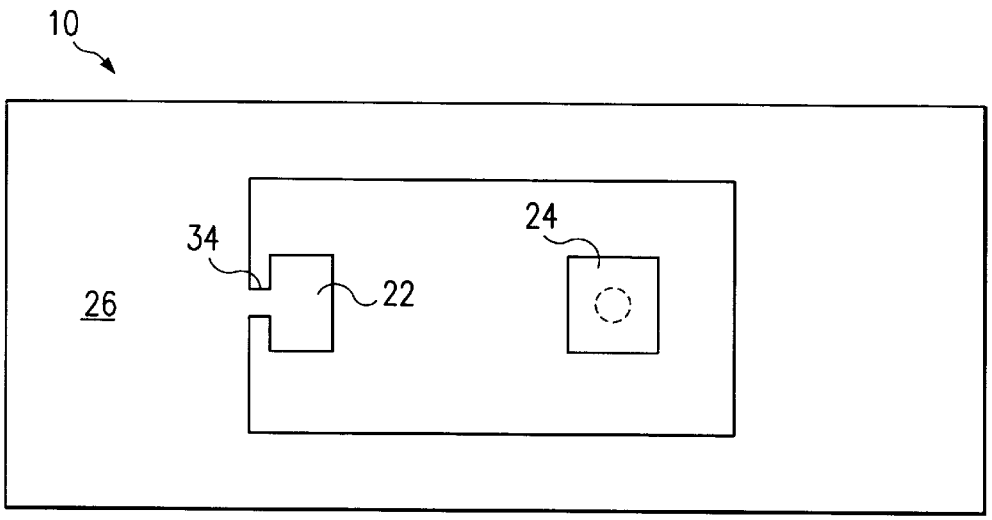
FIG. 1(a) is a top view of third metal of FIG. 1.
Figure 1:
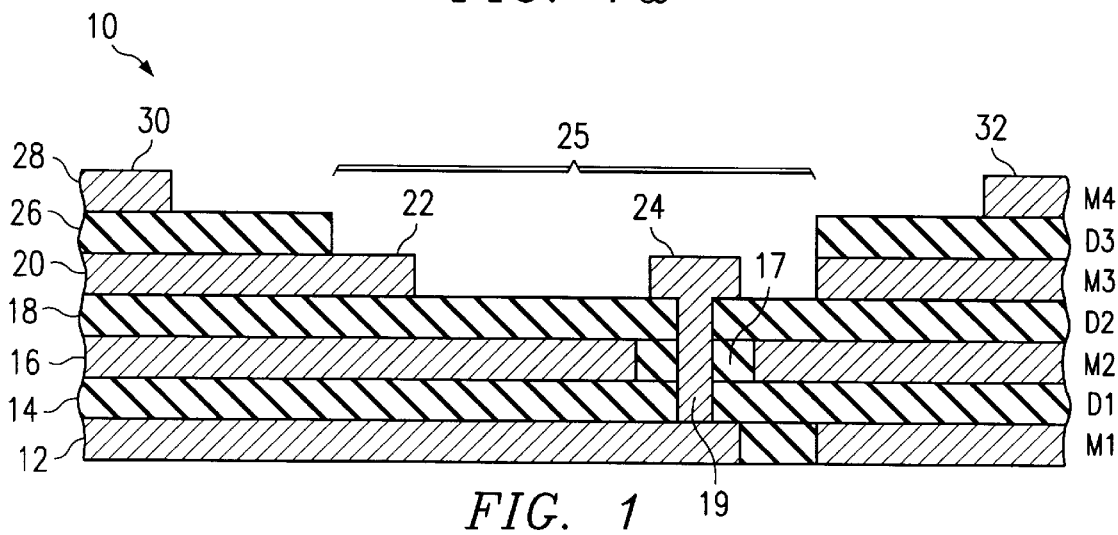
FIG. 1 is a cross-sectional view of a printed circuit board having multiple metallization and insulating layers.

Referring now to FIG. 1, a printed circuit board (PCB) 10 includes patterned metallization layers 12, 16, 20 and 28 and insulator layers 14, 18 and 26. A first patterned metallization layer 12 is electrically separated from a second patterned metallization layer 16 by a first insulating layer 14. Second metal layer 16 is shown having a contact (or hole) 17 through which the first patterned metallization layer 12 connects to a third patterned metallization layer 20 by a metal contact 19 between the first patterned metallization 12 and the third patterned metallization 20, thru insulation layers 14 and 18.

The third metal layer 20 has an exposed metal area or pad 24, which is an electrical extension of the first patterned metallization layer 12, as well as an exposed metal area or pad 22. The two exposed metal areas 22 and 24 are in a large well or cut out area 25 that has been removed from the fourth patterned metallization layer 28 and insulating layer 26 for the purpose of attaching a capacitor (not shown). In this illustrative example, PCB 10 is fabricated by any of the well-known methods, such as photomasking and etching of the metallization layers on single layers of insulator, and subsequent lamination of the individual insulator/metal layers (known as prepreg) to form completed PCB 10. The present invention is distinguished from previous methods in that insulating layer 26 and fourth patterned metallization layer 28, have a large cutout area or well structure 25 designed to receive a capacitor (not shown) or other component. The fourth metallization layer 28 shows two widely spaced metal features, labeled 30 and 32, which are lead attach pads configured to receive the leads of an IC package (not shown).

A method of producing PCBs having the well structure is to cut, route, saw or punch a designed shape hole in a specified number of the layers of laminant (also known as 'prepreg'), used to make the PCB, prior to assembly. Such a well would cut through the top layers of metallization and insulators, typically down to the first voltage reference plane. At that interior location, a set of "landing pads" or electrical attachments for the capacitor are created.

Referring now to FIG. 1(a), a top view of the third patterned metallization layer 20 in FIG. 1, shows two capacitor attachment pads 22 and 24. Pad 22 has a metallization region 34 attaching pad 22 to the remainder of the third patterned metallization layer 20, shown as a metal plane in this illustrative embodiment. The metallization 34 is a thin neck of metal which is used for thermal stress relief. Thermal stress relief is a problem which causes chip capacitor soldering problems during many mass reflow soldering operations.

Figure 2:
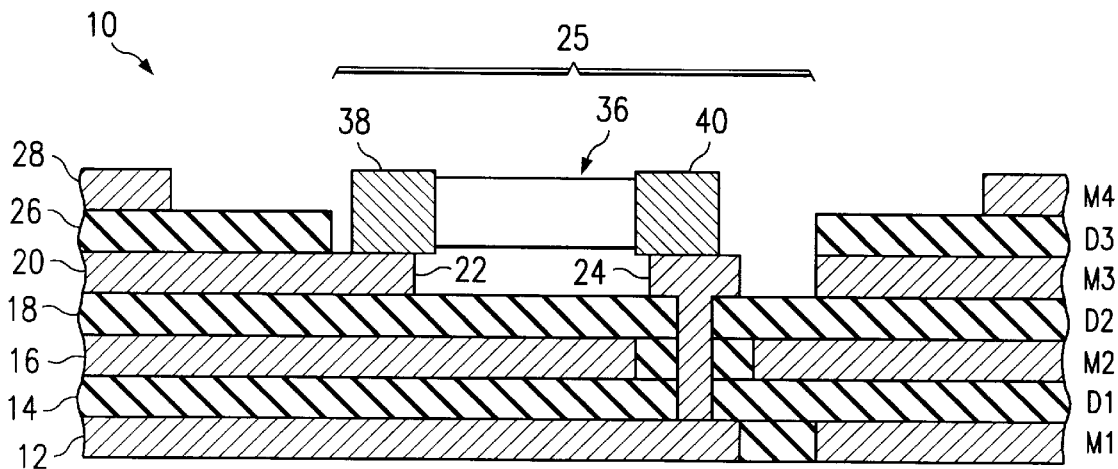
FIG. 2 is a cross-sectional view of a printed circuit board showing the positioning of a capacitor.

Referring now to FIG. 2, the same cross-sectional view of the PCB 10 of FIG. 1 is shown with the addition of a component 36, for purposes of illustration a capacitor, having two metallized end connections 38 and 40. The metallized end connection 38 is shown attached to the metal pad 22, and metallized end connection 40 is shown attached to the metal pad 24 and thus to the first metal patterned metallization 12. The capacitor 36 is attached to metal pads 22 and 24 by any of the attachment or soldering means known in the art, such as infrared belt ovens or vapor phase reflow soldering.

Figure 3:
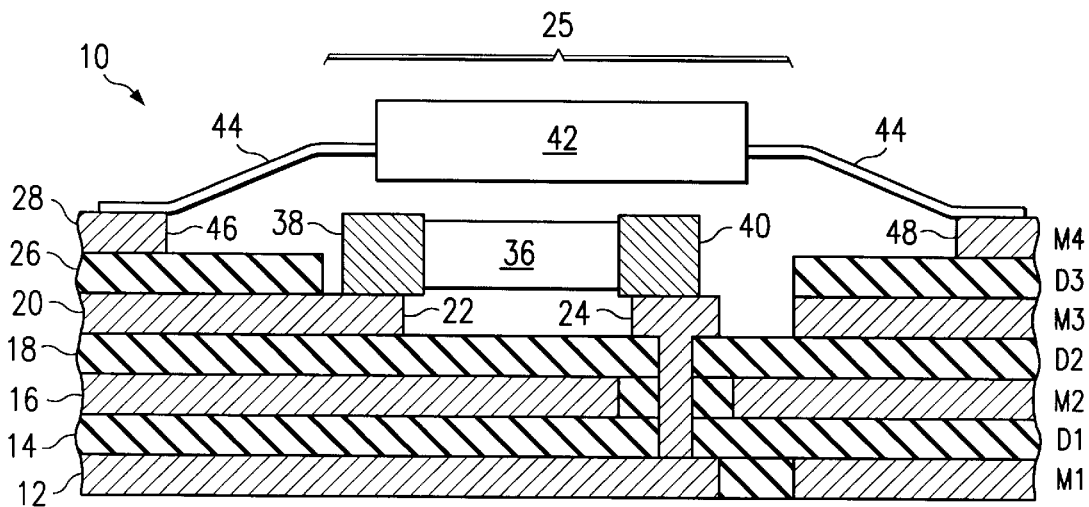
FIG. 3 is a cross-sectional view of a printed circuit board showing a capacitor and an integrated circuit package with leads.

Referring now to FIG. 3, the PCB 10 of FIGS. 1 and 2 is shown with the addition of an IC package 42, having a number of leads 44. In this illustrative embodiment, the IC package leads 44 are shown as having what is known as a "Gull Wing" shape, although numerous other package lead forms are also applicable, such as "J" bend, or "Butt joint". The leads 44 are attached to the fourth patterned metallization layer 28, which in this illustrative embodiment is shown as consisting of two metal lead pads 46 and 48. The IC package 42 will be positioned on PCB 10 by any of the well-known methods, and the IC package leads 44 will be electrically and physically attached to the lead pads 46 and 48 as shown by any of the well-known methods of soldering, e.g., laser, hotbar, or mass reflow method such as infra-red belt ovens or vapor-phase reflow.

Benefits of the present arrangement include positioning the capacitor 36 directly beneath the low profile IC Package 42, in the cutout well 25, results in a sufficient distance between IC 42 and the component 36 to allow proper board cleaning. The space is necessary for the cleaning of the solder residues which result from the attachment of the package 42 and the component 36 to the PCB 10, specifically the attachment of metallized end connector 38 to metal pad 22, and metallized end connector 40 to metal pad 24, as well as the leads 44 of the IC 42 to the metal pads 46 and 48. In soldering technology there is a well known need to have surface metal oxides removed. Typically a "flux" agent is used to remove the metal oxides. Fluxes are often comprised of natural resins which are mildly activated with acidic components, and thus these flux residues represent a contamination source which can cause lifetime failures, such as corrosion on IC joints, like those which may be found between the leads 44 and lead pads 46 and 48, as an example.

Figure 4:
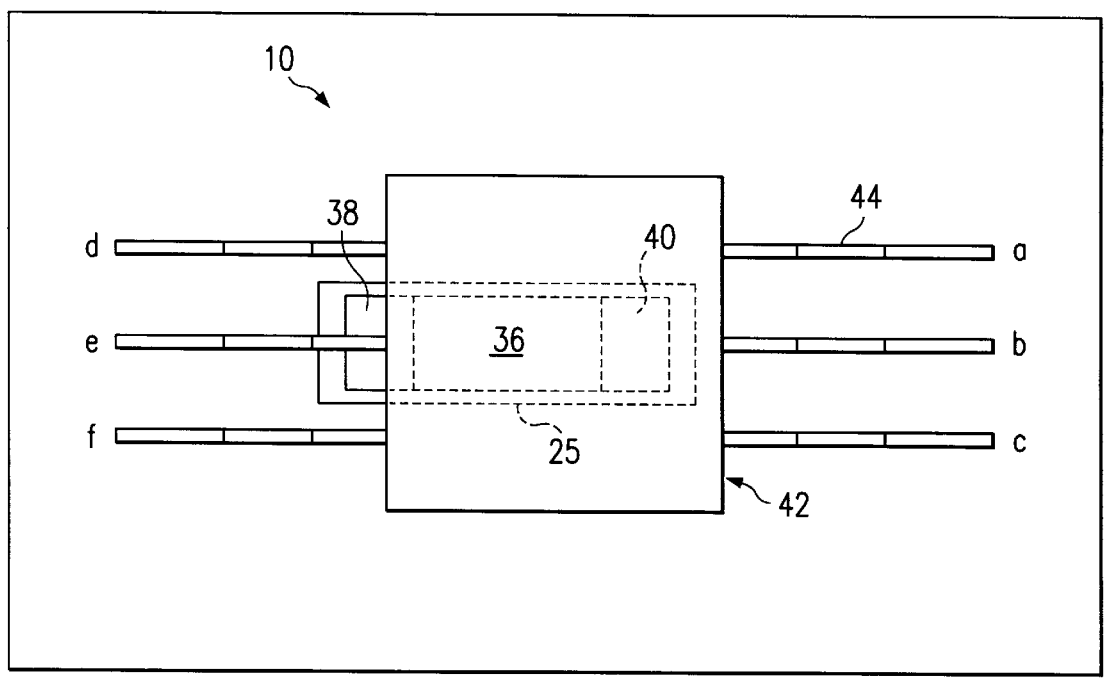
FIG. 4 is a top view of the integrated circuit printed circuit board and capacitor of FIG. 3.

Referring now to FIG. 4, the IC package 42 of FIG. 3 is shown from a top view, with the capacitor 36 having end connectors 38 and 40 in well 25, shown in this illustrative example as being partly beneath IC package 42 and partly exposed on PCB 10. The fourth layer of patterned metallization 28 and the cutout well 25 in the PCB 10 are not shown for simplicity. FIG. 4 shows that the capacitor 36 is predominantly located or positioned directly beneath the IC package 42 and is thus in a position to have the shortest possible electrical distance for charge to travel to react to the current needs of the circuit in IC package 42. The capacitor 36 may be positioned in any location desired as long as the well 25 does not interfere with the leads 44a–f contacting the board 10.

Figure 5:
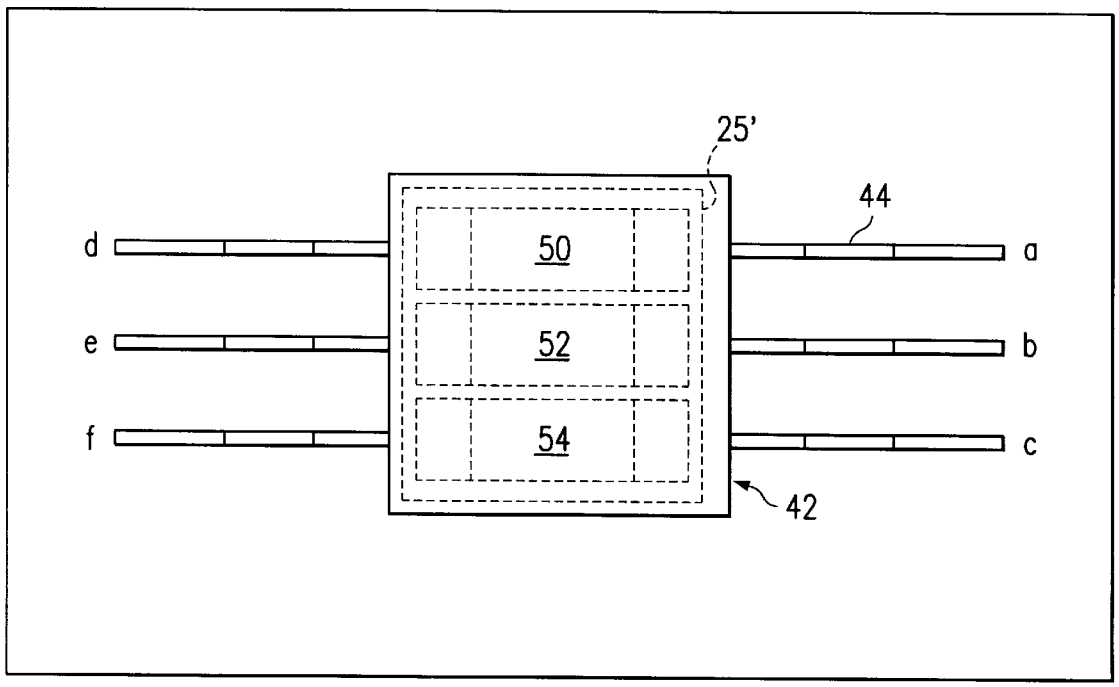
FIG. 5 is a top view of an alternative embodiment with multiple capacitors in a single large well.

Referring now to FIG. 5, an alternative embodiment is shown having multiple components 50, 52 and 54 attached within a single large well structure 25'. The components are shown as being arranged in a parallel fashion in this illustrative example, but other arrangements may be made. For example, there might be four components each aligned parallel to one side of the package 42.

Figure 6:
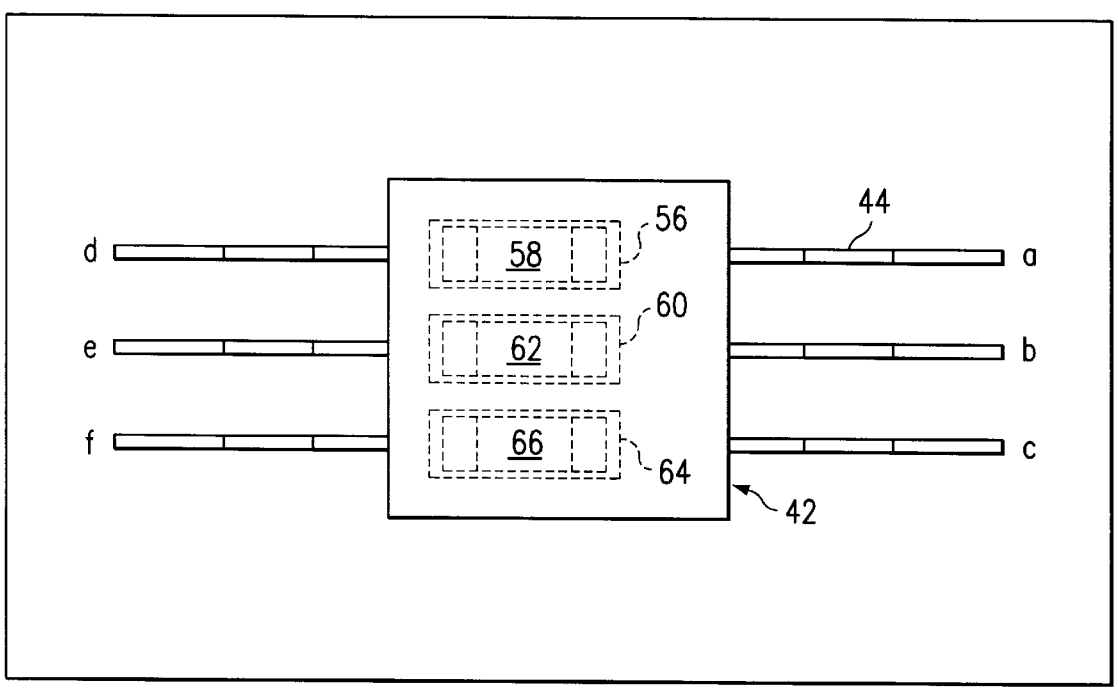
FIG. 6 is a top view of an alternative embodiment with multiple capacitors in multiple small wells.

Referring now to FIG. 6, another alternative embodiment is shown having multiple components 58, 62 and 66 attached within three small well structures 56, 60 and 64. Such an arrangement may be preferable to a single large well structure such as shown in FIG. 5 if component to component shorting is a substantial problem with the particular attachment process being used. The components are again shown as being arranged in a parallel fashion in this illustrative example, but again other arrangements may be made. For example, there might be four components each aligned parallel to one of the sides of the package 42.

The illustrative embodiments show the IC package 42 having six leads labeled 44a–f respectively, but in general, the number of leads on an IC package are typically very large, ranging from 20 to 400. The illustrative embodiments also show IC package 42 with a square profile, but in general, IC package 42 may have any shape and is most commonly rectangular. The illustrative embodiment shows IC package 42 as having leads on only two sides, the left and the right side of the IC package 42, but in general, many IC packages have leads on all four sides of the integrated circuit package 42.

Thus, in accordance with the invention, the provision of a well structure in a PCB results in higher circuit performance, higher PCB density and lower costs for building a PCB. The use of wells allows the use of high-performance, high-speed, low profile low cost packages and lower PCB profiles than those previously available.

Having described a preferred embodiment of the invention, it will now become apparent to those skilled in the art that other embodiments incorporating its concepts may be provided. It is felt therefore, that this invention should not be limited to the disclosed invention, but should be limited only by the spirit and scope of the appended claims.

What is claimed is:

1. An apparatus comprising:
   a printed circuit board having a first plurality of patterned interconnect layers and a second plurality of insulating layers disposed therebetween:
   at least one of said plurality of insulating layers having at least one well structure therein,
   said at least one well structure in said plurality of insulating layers disposed to receive an electrical component therein;
   said at least one well structure is disposed beneath at least a portion of an integrated circuit package attached to said printed circuit board; and
   said electrical component disposed in said at least one well structure is a capacitors located that a connector of said capacitor is exposed on the printed circuit board.

2. An apparatus comprising:
   a printed circuit board having a first plurality of patterned interconnect layers and a second plurality of insulating layers disposed therebetween:
   at least one of said plurality of insulating layers having at least one well structure therein;
   said at least one well structure in at least one of said plurality of insulating layers disposed to receive an electrical component therein;
   an electrical component mounted within said at least one well structure, the electrical component comprising a decoupling capacitor with a first lead electrically connected to a first pad and a second lead electrically connected to a second pad; and
   a packaged integrated circuit attached to the printed circuit board, the packaged integrated circuit including a plurality of pins electrically connected to at least one of the patterned interconnect layers, the packaged integrated circuit located above the decoupling capacitor such that the decoupling capacitor is partly beneath the packaged integrated circuit and partly exposed on the printed circuit board.

3. The apparatus of claim 1 wherein said at least one well structure in said at least one of said plurality of insulating layers comprises a plurality of well structures disposed beneath at least a portion of the packaged integrated circuit package attached to said printed circuit board, each of the plurality of well structures including a decoupling capacitor disposed therein.

4. The apparatus of claim 1 wherein said at least one well structure in said plurality of insulating layers is one of a plurality of well structures, each of said plurality of well structures disposed at least partially beneath a separate one of a plurality of packaged integrated circuits attached to said printed circuit board, each of the plurality of well structures including a capacitor disposed therein.

5. The apparatus of claim 4 wherein said plurality of well structures each contain conductive regions disposed to electrically attach to electrical contacts on said capacitor disposed therein.

6. The apparatus of claim 1 wherein said capacitor is connected directly to a constant voltage interconnect on said printed circuit board.

7. The apparatus of claim 1 wherein said at least one well structure is disposed to receive a plurality of electrical components.

8. A circuit board assembly comprising:
   a printed circuit board having a plurality of patterned interconnect layers including an uppermost interconnect layer, the printed circuit board further comprising a plurality of insulating layers disposed between ones of the plurality of patterned interconnect layers, at least one of the insulating layers having a well structure formed therein;
   a packaged integrated circuit mounted on the printed circuit board and disposed above the uppermost interconnect layer;
   a discrete capacitor component disposed within the well structure and electrically coupled to at least one of the plurality of patterned interconnect layers, the discrete capacitor component at least partially underlying the packaged integrated circuit, the discrete capacitor component being directly connected to a voltage supply plane such that the discrete capacitor component serves as a decoupling capacitor for the packaged integrated circuit; and
   wherein the packaged integrated circuit partially overlies the discrete capacitor component such that said discrete capacitor component is partly beneath the packaged integrated circuit and partly exposed on the printed circuit board.

9. The assembly of claim 8 and further comprising at least one other discrete capacitor component disposed within the well structure and laterally spaced from the discrete capacitor component, the at least one other discrete capacitor component being electrically coupled to at least one of the plurality of patterned interconnect layers.

10. The assembly of claim 8 and further comprising:
    a second well structure formed within the at least one of the insulating layers, the packaged integrated circuit at least partially overlying the second well structure; and
    a second discrete capacitor component disposed within the well structure and electrically coupled to at least one of the plurality of patterned interconnect layers.

11. The assembly of claim 8 and further comprising a plurality of other packaged integrated circuits mounted on the printed circuit board, each of the other packaged integrated circuits overlying at least one decoupling capacitor, each decoupling capacitor mounted within a well that is formed within the at least one of the insulating layers.

12. The assembly of claim 8 wherein the voltage supply plane comprises a power plane on the printed circuit board.

13. The assembly of claim 8 wherein the voltage supply plane comprises a ground plane on the printed circuit board.

14. The assembly of claim 8 wherein the packaged integrated circuit overlies the discrete capacitor component by about 0.03 inches.

15. A circuit board assembly comprising:
    a printed circuit board having a plurality of patterned interconnect layers including an uppermost interconnect layer and another interconnect layer, the printed circuit board further comprising a plurality of insulating layers disposed between ones of the plurality of patterned interconnect layers, at least one of the insulating layers having well structures formed therein;

a plurality of capacitor components electrically coupled to at least one of the patterned interconnect layers of the printed circuit board, capacitor components disposed within said wells; and a packaged integrated circuit mounted on the printed circuit board, the packaged integrated circuit including a plurality of pins electrically connected to at least one of the patterned interconnect layers, the packaged integrated circuit located at least partially above each of the plurality of capacitor components to partly expose said capacitor components on the printed circuit board.

16. The assembly of claim 15 wherein each one of the plurality of capacitor components disposed within an individual one of the wells.

17. The assembly of claim 15 wherein the plurality of capacitor components are arranged so as to provide separate capacitance to individual sides of the packaged integrated circuit.

* * * * *